(12) United States Patent
Sasaki et al.

(10) Patent No.: US 10,410,902 B2
(45) Date of Patent: Sep. 10, 2019

(54) PLASMA PROCESSING APPARATUS

(71) Applicant: Tokyo Electron Limited, Tokyo (JP)

(72) Inventors: Yasuharu Sasaki, Miyagi (JP); Akihito Fushimi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/921,857

(22) Filed: Mar. 15, 2018

(65) Prior Publication Data
US 2018/0204756 A1 Jul. 19, 2018

Related U.S. Application Data

(62) Division of application No. 14/532,138, filed on Nov. 4, 2014, now Pat. No. 9,953,854.

(30) Foreign Application Priority Data

Nov. 19, 2013 (JP) .................. 2013-238854

(51) Int. Cl.
*H01L 21/683* (2006.01)
(52) U.S. Cl.
CPC ..... *H01L 21/6833* (2013.01); *Y10T 29/49998* (2015.01); *Y10T 279/23* (2015.01)

(58) Field of Classification Search
CPC .................................................. H01L 21/6833
See application file for complete search history.

(56) References Cited

U.S. PATENT DOCUMENTS

2012/0160808 A1  6/2012  Kikuchi
2014/0340813 A1  11/2014  Anada

FOREIGN PATENT DOCUMENTS

| | | |
|---|---|---|
| CN | 101443900 A | 5/2009 |
| JP | H04-022152 A | 1/1992 |
| JP | 2003-332412 A | 11/2003 |
| JP | 2010-183074 A | 8/2010 |
| JP | 2013-016554 A | 1/2013 |
| JP | 2013-084935 A | 5/2013 |
| WO | 2007/100571 A2 | 9/2007 |

*Primary Examiner* — Moshe Wilensky
(74) *Attorney, Agent, or Firm* — Pearne & Gordon LLP

(57) ABSTRACT

A plasma processing apparatus of processing a processing target object within a depressurized space is provided. The plasma processing apparatus includes a processing vessel that partitions a depressurizable space; a mounting table, provided within the processing vessel, having an electrostatic chuck which is for a focus ring and has three electrodes; a power supply configured to apply three AC voltages having different phases to the three electrodes, respectively, to adsorb a target object on the electrostatic chuck.

2 Claims, 8 Drawing Sheets

PLASMA PROCESSING APPARATUS

CROSS-REFERENCE TO RELATED APPLICATION

This is a divisional application of U.S. patent application Ser. No. 14/532,138, filed on Nov. 4, 2014, which claims the benefit of Japanese Patent Application No. 2013-238854 filed on Nov. 19, 2013, the entire disclosures of which are incorporated herein by reference.

TECHNICAL FIELD

The embodiments described herein pertain generally to a method of adsorbing a target object on a mounting table and a plasma processing apparatus.

BACKGROUND

In manufacturing an electronic device such as a semiconductor device, a target object is accommodated within a decompression processing vessel and a process is performed on the target object. The process performed on the target object is, for example, a plasma process, and more specifically, an etching process or a film forming process. In a processing apparatus for this process, a mounting table is provided within the processing vessel and the target object is mounted on the mounting table. For this reason, the mounting table includes an electrostatic chuck.

A single-electrode type and a double-electrode type have been known as the electrostatic chuck. A single-electrode type electrostatic chuck includes a single electrode and dielectric films, and the electrode is provided within the dielectric films. Further, in the single-electrode type electrostatic chuck, a DC voltage is applied to the electrode. In the single-electrode type electrostatic chuck, when the DC voltage is applied to the electrode, a surface of the electrostatic chuck is electrified. Furthermore, since a target object is electrically grounded, a surface of the target object facing the electrostatic chuck is electrified with polarities opposite to those of the surface of the electrostatic chuck. Thus, a potential difference between the surface of the electrostatic chuck and the target object is made, so that the target object is adsorbed on the electrostatic chuck.

A double-electrode type electrostatic chuck includes two electrodes and a dielectric film, and the two electrodes are provided within the dielectric film. In the double-electrode type electrostatic chuck, DC voltages different from each other are respectively applied to the two electrodes. In the double-electrode type electrostatic chuck, when the DC voltages different from each other are respectively applied to the two electrodes, there is made a potential difference within the electrostatic chuck and a positively charged region and a negatively charged region are formed on the surface of the electrostatic chuck. Further, a surface of the target object facing the electrostatic chuck is electrified with polarities opposite to those of the surface of the electrostatic chuck. Thus, a potential difference between the surface of the electrostatic chuck and the target object is made, so that the target object is adsorbed on the electrostatic chuck. These single-electrode type and double-electrode type electrostatic chucks are described in Japanese Patent Laid-open Publication No. 2013-016554.

Patent Document 1: Japanese Patent Laid-open Publication No. 2013-016554

In the single-electrode type chuck and the double-electrode type electrostatic chuck described above, the surfaces of the electrostatic chucks can be easily electrified. By way of example, a product generated by performing a process on the target object adheres to the surface of the electrostatic chuck, so that a modified layer is formed and the modified layer can be easily electrified. If the surface of the electrostatic chuck is modified, an abnormality in electrification may occur and an adsorptive force with respect to the target object may be decreased. Further, even after the application of the voltage to the electrode is stopped, electric charges remaining on the surface of the electrostatic chuck may generate the Coulomb force between the electrostatic chuck and the target object. Since it is difficult to find out an amount of remaining electric charges accurately, it may also be difficult to remove the electric charges from the surface of the electrostatic chuck.

Therefore, in the present technical field, it has been required to suppress the adsorptive force of an electrostatic chuck from being decreased and also required to suppress the electric charges from remaining on the surface of the electrostatic chuck.

SUMMARY

In one example embodiment, a method of adsorbing a target object on a mounting table is provided. The mounting table is provided within a processing vessel that partitions a depressurizable space in a processing apparatus which processes a processing target object within the space. Further, the processing apparatus serves as a plasma processing apparatus. The method includes mounting the target object on an electrostatic chuck of the mounting table; and applying three AC voltages having different phases to three electrodes of the electrostatic chuck, respectively.

In the method of adsorbing the target object on the mounting table, the AC voltages respectively applied to the three electrodes have different phases, so that all of the voltages applied to the three electrodes of the electrostatic chuck cannot have the same potential at the same time. Therefore, in a period during which the three AC voltages are respectively applied to the three electrodes, a potential difference between any two of the three electrodes of the electrostatic chuck is made, and a positively charged region and a negatively charged region are formed on a surface of the electrostatic chuck. Further, a surface of the target object facing the electrostatic chuck is electrified with polarities opposite to those of the surface of the electrostatic chuck. As a result, during the period, a potential difference between the surface of the electrostatic chuck and the processing target object is continuously made. Therefore, during the period, a state in which an adsorptive force is continuously generated is maintained. Further, an amount of electric charges is proportional to the integral over time of the electric field intensity, and the AC voltages, each having a positive voltage and a negative voltage alternately, are applied to the three electrodes of the electrostatic chuck. Thus, it is possible to suppress an amount of electric charges on the surface of the electrostatic chuck. Therefore, it is possible to suppress an adsorptive force of the electrostatic chuck from being decreased and also possible to suppress electric charges from remaining on the surface of the electrostatic chuck.

The target object may be a wafer, and the electrostatic chuck may be an electrostatic chuck for the wafer.

Further, the target object may be a focus ring. The focus ring may be provided on the mounting table and configured to surround an edge of a wafer, and the electrostatic chuck may be an electrostatic chuck for the focus ring.

Further, the method may further include attracting the focus ring to the electrostatic chuck by operating a depressurization pump connected to a gas line through which a heat transfer gas is supplied into a gap between the electrostatic chuck and the focus ring after the mounting of the target object; and depressurizing the space within the processing vessel after the attracting of the focus ring. Further, after the depressurizing of the space, the applying of the three AC voltages may be performed. When the focus ring is mounted on the electrostatic chuck, a pressure of the space within the processing vessel is generally set to be the atmospheric pressure. Further, in the method, the focus ring is position-aligned and mounted on the electrostatic chuck under the atmospheric pressure, and then, the depressurization pump is operated to attract the focus ring to the electrostatic chuck. Then, the space within the processing vessel is depressurized, and the AC voltages are respectively applied to the three electrodes. Thus, the focus ring is adsorbed on the electrostatic chuck with a Coulomb force. As such, the voltages are not applied to the electrodes of the electrostatic chuck under the atmospheric pressure, so that it is possible to avoid an electric shock and also possible to suppress dust in the atmosphere from being adsorbed on the electrostatic chuck. Further, since the space within the processing vessel is depressurized while maintaining the state in which the focus ring is attracted to the electrostatic chuck, it is possible to suppress the position of the focus ring from being deviated during the depressurization. Furthermore, since the position deviation of the focus ring is suppressed, it is possible to improve controllability of the temperature of the focus ring while the processing target object is processed.

In another example embodiment, a plasma processing apparatus of processing a processing target object within a depressurized space includes a processing vessel that partitions a depressurizable space; a mounting table, provided within the processing vessel, having an electrostatic chuck which has three electrodes; and a power supply configured to apply three AC voltages having different phases to the three electrodes, respectively, to adsorb a target object on the electrostatic chuck.

The electrostatic chuck may be an electrostatic chuck for a wafer. Further, the electrostatic chuck may be an electrostatic chuck for a focus ring. Furthermore, the plasma processing apparatus may further include a depressurization pump. Further, the mounting table may include a gas line through which a heat transfer gas is supplied into a gap between the electrostatic chuck and the focus ring, and the depressurization pump may be connected to the gas line.

In accordance with the example embodiments, it is possible to suppress an adsorptive force of the electrostatic chuck from being decreased, and also possible to suppress electric charges from remaining on the surface of the electrostatic chuck.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
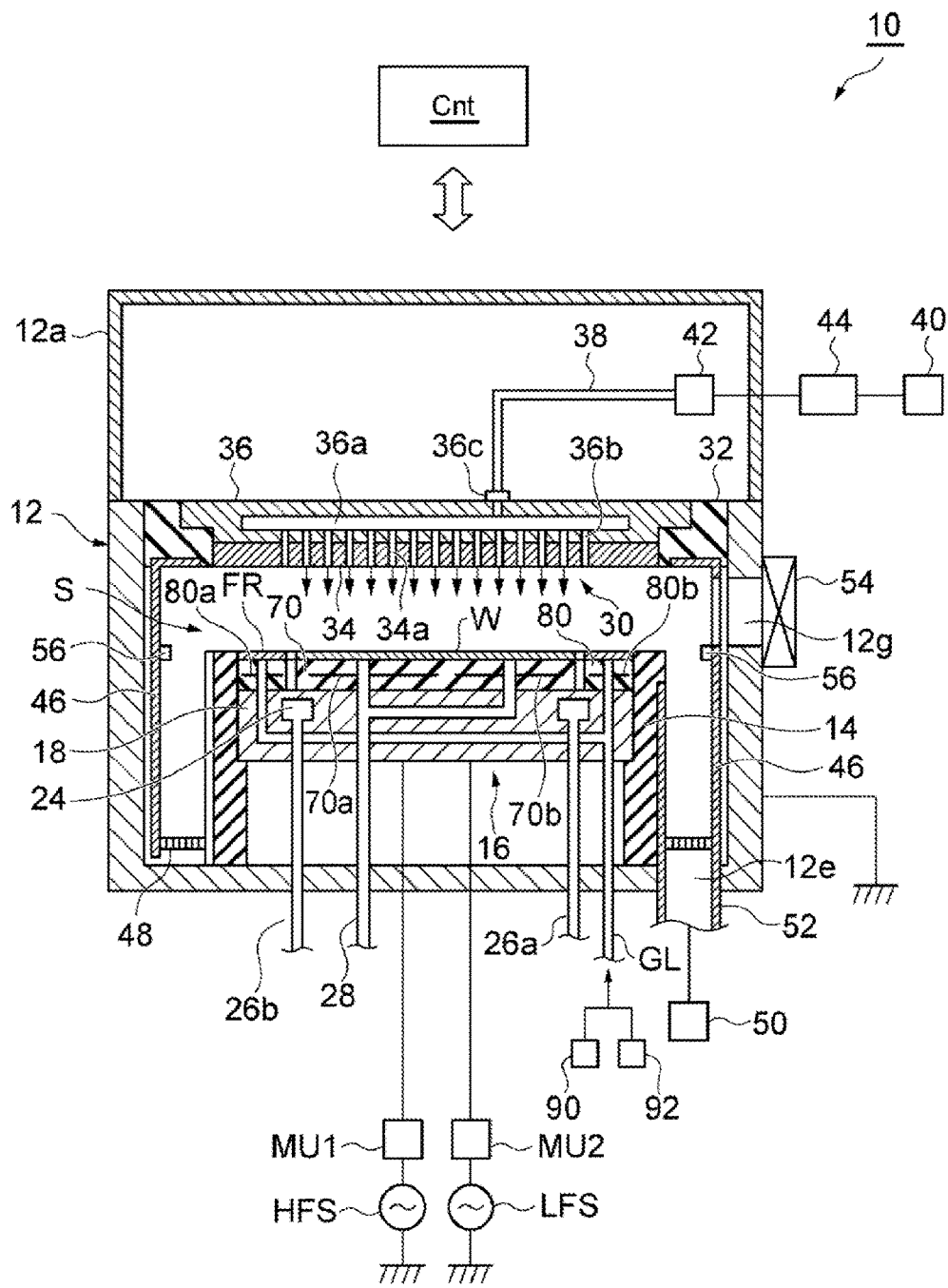
FIG. 1 is a diagram schematically showing a processing apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

A processing apparatus used in various example embodiments of a method of adsorbing a target object on a mounting table will be explained first. FIG. 1 is a diagram schematically showing the processing apparatus in accordance with the example embodiment. FIG. 1 schematically shows a cross-sectional configuration of the processing apparatus in accordance with the example embodiment. As depicted in FIG. 1, the processing apparatus in accordance with the example embodiment is a plasma processing apparatus 10.

The plasma processing apparatus 10 is a capacitively coupled parallel plate type plasma processing apparatus, and includes a processing vessel 12. The processing vessel 12 has a substantially cylindrical shape, and partitions a space S therein. The processing vessel 12 is made of, for example, aluminum. By way of example, a surface of the processing vessel 12 is anodically oxidized. Further, the processing vessel 12 is frame-grounded.

Within the processing vessel 12, a mounting table 16 is provided. The mounting table 16 includes a lower electrode 18, a first electrostatic chuck 70, and a second electrostatic chuck 80. The lower electrode 18 is formed of a metal such as aluminum, and has a substantially disc shape. This lower electrode 18 is supported by a supporting member 14. The supporting member 14 is provided on a bottom of the processing vessel 12. The supporting member 14 is formed of, for example, an insulating material, and has a cylindrical shape.

The lower electrode 18 is connected to a first high frequency power supply HFS via a matching unit MU1. The first high frequency power supply HFS is configured to generate a high frequency power for plasma generation having a frequency of from 27 MHz to 100 MHz, for example, 40 MHz. The matching unit MU1 includes a circuit configured to match an output impedance of the first high frequency power supply HFS with an input impedance of a load side (on the side of the lower electrode 18).

Further, the lower electrode 18 is connected to a second high frequency power supply LFS via a matching unit MU2. The second high frequency power supply LFS is configured to generate a high frequency power (high frequency bias power) for ion attraction into a target object (hereinafter, referred to "wafer W") and apply the high frequency bias power to the lower electrode 18. The high frequency bias power has a frequency of from 400 kHz to 13.56 MHz, and for example, 3 MHz. The matching unit MU2 includes a circuit configured to match an output impedance of the second high frequency power supply LFS with an input impedance of the load side (on the side of the lower electrode 18).

On the lower electrode 18, the first electrostatic chuck 70 and the second electrostatic chuck 80 are provided. The first electrostatic chuck 70 is configured to electrostatically adsorb the wafer W mounted on an upper surface thereof with a Coulomb force. The second electrostatic chuck 80 is annularly extended to surround the first electrostatic chuck 70. The second electrostatic chuck 80 is configured to electrostatically adsorb a focus ring FR mounted on an upper surface thereof with a Coulomb force. The focus ring FR is mounted on the second electrostatic chuck 80 to surround an edge of the wafer W in order to improve uniformity in the process on the wafer W. The focus ring FR is formed of a material selected appropriately for a process performed on the wafer. By way of example, the focus ring FR may be formed of silicon or quartz.

Within the lower electrode 18, a coolant path 24 is formed. A coolant, for example, cooling water, having a preset temperature is supplied and circulated in the coolant path 24 through lines 26a and 26b from a chiller unit provided outside. By controlling the temperature of the coolant, a temperature of the wafer W mounted on the first electrostatic chuck 70 is controlled.

Further, the plasma processing apparatus 10 includes a gas supply line 28. Through the gas supply line 28, a heat transfer gas, e.g., a He gas, is supplied from a heat transfer gas supply unit into a gap between the upper surface of the first electrostatic chuck 70 and a rear surface of the wafer W.

Furthermore, the plasma processing apparatus 10 further includes an upper electrode 30. The upper electrode 30 is provided above the lower electrode 18 and arranged to face the lower electrode 18. The lower electrode 18 and the upper electrode 30 are arranged in substantially parallel with each other.

The upper electrode 30 is supported on a ceiling portion of the processing vessel 12 via an insulating shield member 32. The upper electrode 30 may include an electrode plate 34 and an electrode supporting body 36. The electrode plate 34 faces the space S. The electrode plate 34 has multiple gas discharge holes 34a. The electrode plate 34 may be formed of a conductor or a semiconductor of low resistance having low Joule heat.

The electrode supporting body 36 is configured to detachably support the electrode plate 34, and may be formed of a conductive material such as aluminum. The electrode supporting body 36 may have a water cooling structure. Within the electrode supporting body 36, a gas diffusion space 36a is formed. Multiple gas through holes 36b communicating with the gas discharge holes 34a are extended downwardly from the gas diffusion space 36a. Further, the electrode supporting body 36 has a gas inlet opening 36c through which a processing gas is introduced into the gas diffusion space 36a, and the gas inlet opening 36c is connected to a gas supply line 38.

The gas supply line 38 is connected to a gas source 40 via a valve 42 and a flow rate controller 44. The gas source 40 is configured to supply one or more kinds of gases selected for a process performed on the wafer W into the gas supply line 38 through the valve 42 and the flow rate controller 44. The gases supplied into the gas supply line 38 reach the gas diffusion space 36a and are discharged into the space S through the gas through holes 36b and the gas discharge holes 34a.

Further, the plasma processing apparatus 10 may further include a ground conductor 12a. The ground conductor 12a has a substantially cylindrical shape, and extends from a side wall of the processing vessel 12 to a height position above the upper electrode 30.

Furthermore, in the plasma processing apparatus 10, a deposition shield 46 is detachably provided along an inner wall of the processing vessel 12. The deposition shield 46 is also provided at an outer periphery of the supporting member 14. The deposition shield 46 is configured to suppress etching by-products (deposits) from adhering to the processing vessel 12, and is formed by coating ceramics such as $Y_2O_3$ or the like on an aluminum material.

On the bottom portion of the processing vessel 12, a gas exhaust plate 48 is provided between the supporting member 14 and the inner wall of the processing vessel 12. By way of example, the gas exhaust plate 48 may be formed by coating ceramics such as $Y_2O_3$ or the like on an aluminum material. In the processing vessel 12, a gas exhaust opening 12e is provided below the gas exhaust plate 48. The gas exhaust opening 12e is connected to a gas exhaust device 50 via a gas exhaust line 52. The gas exhaust device 50 has a vacuum pump such as a turbo-molecular pump or the like, and can depressurize the space S within the processing vessel 12 to a desired vacuum level. Further, a loading/unloading opening 12g for the wafer W is formed at the side wall of the processing vessel 12, and can be opened and closed by a gate valve 54.

A conductive member (GND block) 56 is provided on the inner wall of the processing vessel 12. The conductive member 56 is provided on the inner wall of the processing vessel 12 to be positioned at the substantially same height as that of the wafer W. The conductive member 56 is DC-connected to the ground, and can suppress abnormal electric discharge.

Further, the plasma processing apparatus 10 may include a control unit Cnt. The control unit Cnt may be a computer including a processor, a storage unit, an input device, a display device or the like, and controls respective units of the plasma processing apparatus 10. In the control unit Cnt, an operator can input commands to manage the plasma processing apparatus 10 through the input device, and an operation status of the plasma processing apparatus 10 can be visually displayed on the display device. Further, the storage unit of the control unit Cnt stores therein a control program for controlling various processes performed in the plasma processing apparatus 10 by the processor, or a program, i.e., a processing recipe, for performing processes on the respective components of the plasma processing apparatus 10 according to processing conditions.

Figure 2:
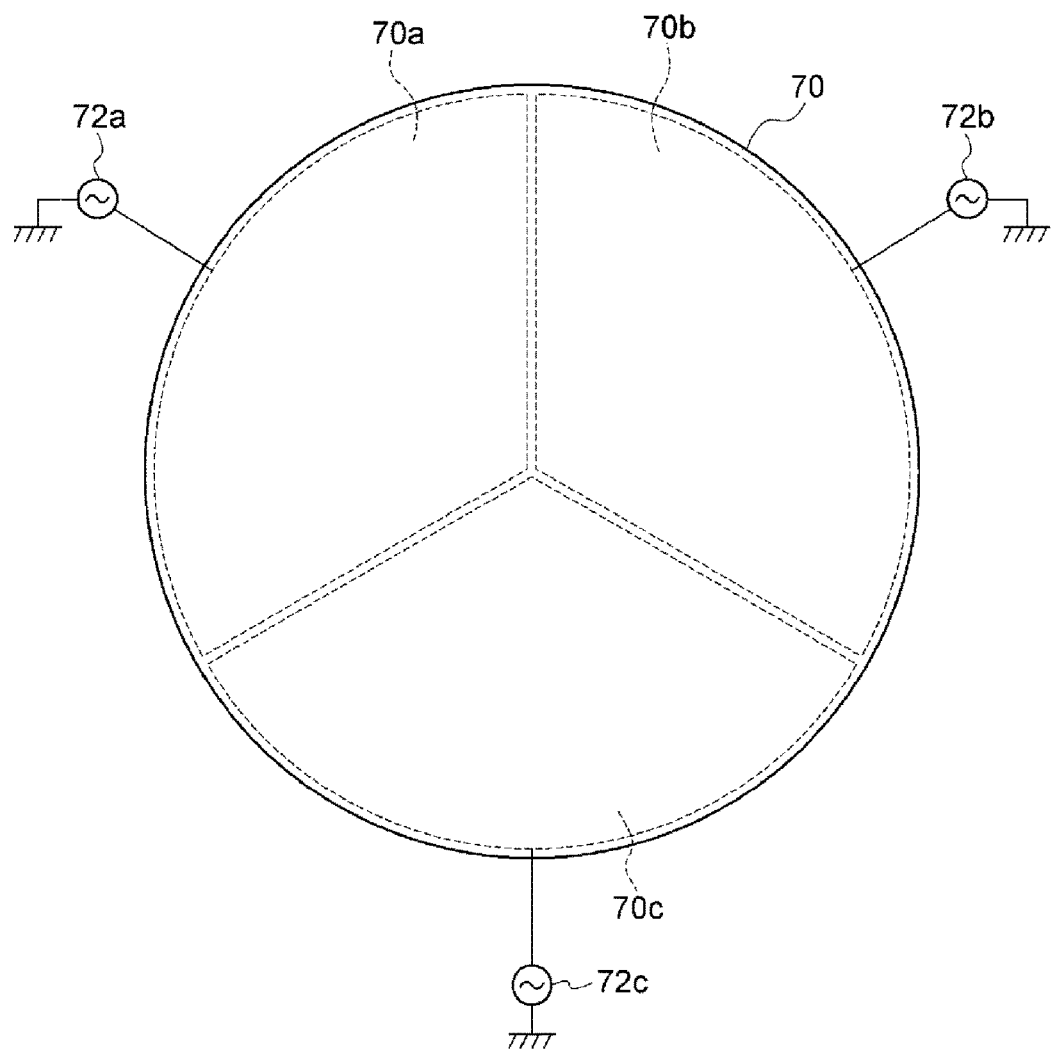
FIG. 2 is a plane view illustrating a first electrostatic chuck in accordance with the example embodiment.
Figure 3:
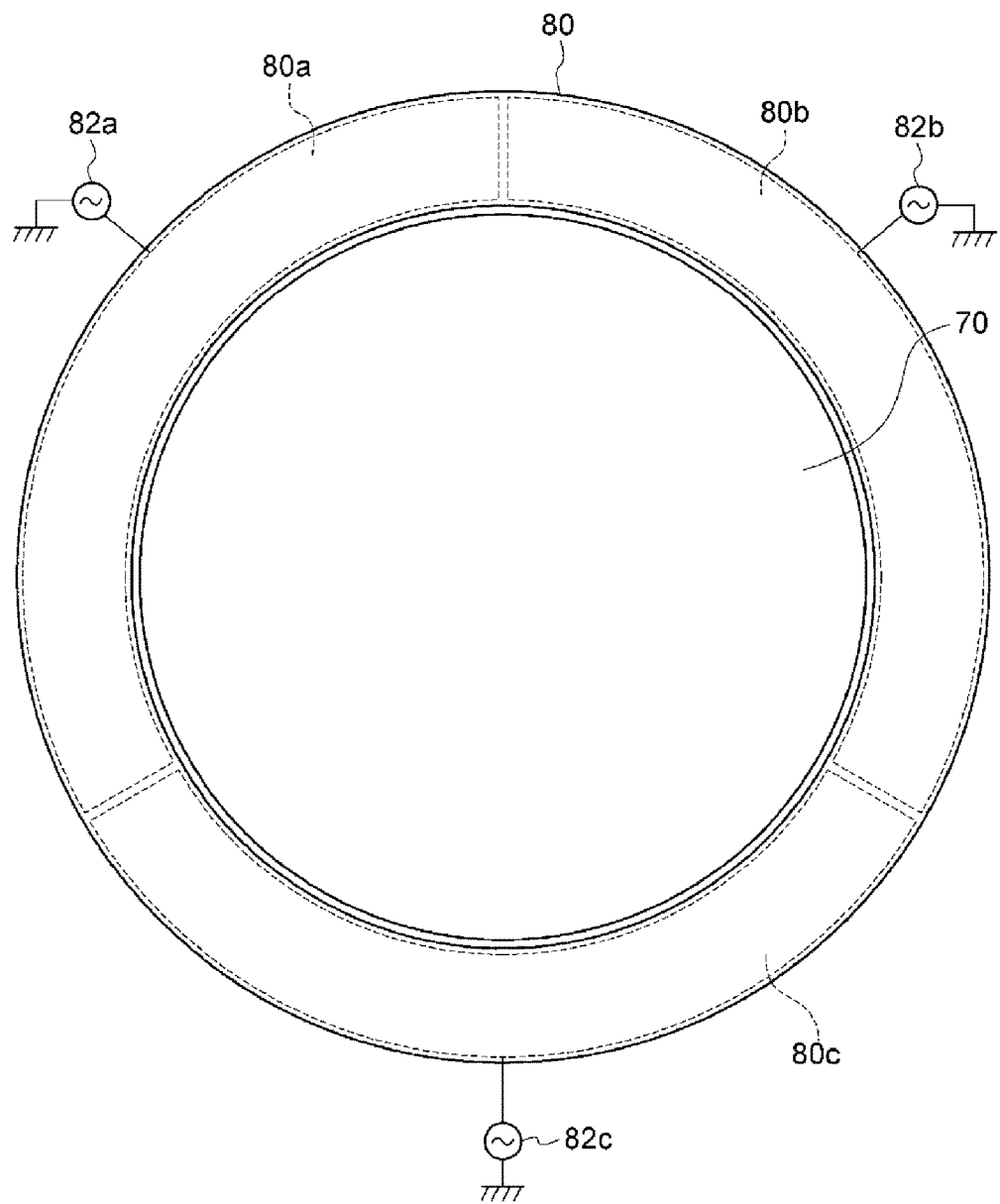
FIG. 3 is a plane view illustrating a second electrostatic chuck in accordance with the example embodiment.

Hereinafter, referring to FIG. 2 and FIG. 3 together with FIG. 1, details of the mounting table 16 will be additionally explained. FIG. 2 is a plane view illustrating the first electrostatic chuck in accordance with the example embodiment. Further, FIG. 3 is a plane view illustrating the second electrostatic chuck in accordance with the example embodiment.

As depicted in FIG. 1 and FIG. 2, on the lower electrode 18 of the mounting table 16, the first electrostatic chuck 70 is provided. The first electrostatic chuck 70 has a substantially disc shape. The first electrostatic chuck 70 includes three electrodes, i.e. an electrode 70a, an electrode 70b, and an electrode 70c. Each of the electrode 70a, the electrode 70b, and the electrode 70c is provided between a pair of insulating layers or insulating sheets. Otherwise, each of the electrode 70a, the electrode 70b, and the electrode 70c is provided as an inner layer of an insulating layer.

As depicted in FIG. 2, each of the electrode 70a, the electrode 70b, and the electrode 70c in accordance with the example embodiment has a substantially fan and plane shape, and they are arranged in a circumferential direction with respect to a central axis line of the first electrostatic chuck 70. The electrode 70a, the electrode 70b, and the electrode 70c are electrically connected to three power supplies, i.e. a power supply 72a, a power supply 72b, and a power supply 72c, respectively. Each of the power supply 72a, the power supply 72b, and the power supply 72c is configured to generate an AC voltage. In the example embodiment, the AC voltages respectively generated by the power supply 72a, the power supply 72b, and the power supply 72c have the same frequency and have an average voltage of 0 V. Further, the AC voltages respectively generated by the power supply 72a, the power supply 72b, and the power supply 72c have different phases. By way of example, a phase difference among the AC voltages respectively generated by the power supply 72a, the power supply 72b, and the power supply 72c is set to be 120 degrees.

As such, in the plasma processing apparatus 10, three AC voltages having different phases are respectively applied to the electrode 70a, the electrode 70b, and the electrode 70c of the first electrostatic chuck 70. If the three AC voltages are respectively applied to the electrode 70a, the electrode 70b, and the electrode 70c, a surface of the first electrostatic chuck 70 is electrified. Thus, a potential difference between the surface of the first electrostatic chuck 70 and the wafer W is made. Therefore, the wafer W is electrostatically adsorbed on the first electrostatic chuck 70.

Further, since the AC voltages respectively applied to the electrode 70a, the electrode 70b, and the electrode 70c have different phases, all of the AC voltages respectively applied to the electrode 70a, the electrode 70b, and the electrode 70c of the first electrostatic chuck 70 cannot have the same potential at the same time. Therefore, in a period during which the three AC voltages are respectively applied to the electrode 70a, the electrode 70b, and the electrode 70c (hereinafter, referred to "application period"), potential differences between any two of the electrode 70a, the electrode 70b, and the electrode 70c are made, and a positively charged region, and a negatively charged region are formed on the surface of the first electrostatic chuck 70. Furthermore, a surface of the wafer W facing the first electrostatic chuck 70 is electrified with polarities opposite to those of the surface of the first electrostatic chuck 70. As a result, during the application period, a potential difference between the surface of the first electrostatic chuck 70 and the wafer W is continuously made. Therefore, during the application period, a state in which the adsorptive force is continuously generated is maintained. Further, an amount of electric charges is proportional to the integral over time of the electric field intensity, and the AC voltages, each having a positive voltage and a negative voltage alternately, are respectively applied to the electrode 70a, the electrode 70b, and the electrode 70c. Thus, it is possible to suppress an amount of electric charges on the surface of the first electrostatic chuck 70. Therefore, it is possible to suppress the adsorptive force of the first electrostatic chuck 70 from being decreased and also possible to suppress the electric charges from remaining on the surface of the first electrostatic chuck 70.

Further, as depicted in FIG. 1 and FIG. 3, on the lower electrode 18 of the mounting table 16, the second electrostatic chuck 80 is provided to surround the first electrostatic chuck 70. The second electrostatic chuck 80 is substantially annularly extended. The second electrostatic chuck 80 includes three electrodes, i.e. an electrode 80a, an electrode 80b, and an electrode 80c. Each of the electrode 80a, the electrode 80b, and the electrode 80c is provided between a pair of insulating layers or insulating sheets. Alternatively, each of the electrode 80a, the electrode 80b, and the electrode 80c is provided as an inner layer of an insulating layer.

As depicted in FIG. 3, each of the electrode 80a, the electrode 80b, and the electrode 80c in accordance with the example embodiment has a substantially fan and plane shape, and they are arranged in a circumferential direction with respect to a central axis line of the second electrostatic chuck 80. The electrode 80a, the electrode 80b, and the electrode 80c are electrically connected to three power supplies, i.e. a power supply 82a, a power supply 82b, and a power supply 82c, respectively. Each of the power supply 82a, the power supply 82b, and the power supply 82c is configured to generate an AC voltage. In the example embodiment, the AC voltages respectively generated by the power supply 82a, the power supply 82b, and the power supply 82c have the same frequency and have an average voltage of 0 V. Further, the AC voltages respectively generated by the power supply 82a, the power supply 82b, and the power supply 82c have different phases. By way of example, a phase difference among the AC voltages respectively generated by the power supply 82a, the power supply 82b, and the power supply 82c is set to be 120 degrees.

In the plasma processing apparatus 10, three AC voltages having different phases are respectively applied to the electrode 80a, the electrode 80b, and the electrode 80c of the second electrostatic chuck 80. If the three AC voltages are respectively applied to the electrode 80a, the electrode 80b, and the electrode 80c, a surface of the second electrostatic chuck 80 is electrified. Thus, a potential difference between the surface of the second electrostatic chuck 80 and the focus ring FR is made. Therefore, the focus ring FR is electrostatically adsorbed on the second electrostatic chuck 80.

Further, since the AC voltages respectively applied to the electrode 80a, the electrode 80b, and the electrode 80c have different phases, all of the AC voltages respectively applied to the electrode 80a, the electrode 80b, and the electrode 80c of the second electrostatic chuck 80 cannot have the same potential at the same time. Therefore, in a period during which the three AC voltages are respectively applied to the electrode 80a, the electrode 80b, and the electrode 80c, i.e. during the application period, potential differences between any two of the electrode 80a, the electrode 80b, and the electrode 80c are made, and a positively charged region and a negatively charged region are formed on the surface of the second electrostatic chuck 80. Furthermore, a surface of the focus ring FR facing the second electrostatic chuck 80 is electrified with polarities opposite to those of the surface of the second electrostatic chuck 80. As a result, during the application period, a potential difference between the surface of the second electrostatic chuck 80 and the focus ring FR is continuously made. Therefore, during the application period, a state in which the adsorptive force is continuously generated is maintained. Further, the AC voltages, each having a positive voltage and a negative voltage alternately, are respectively applied to the electrode 80a, the electrode 80b, and the electrode 80c. Thus, it is possible to suppress an amount of electric charges on the surface of the second electrostatic chuck 80. Therefore, it is possible to suppress the adsorptive force of the second electrostatic chuck 80 from being decreased, and also possible to suppress the electric charges from remaining on the surface of the second electrostatic chuck 80.

Further, in the example embodiment, as depicted in FIG. 1, the mounting table 16 includes a gas line GL. The gas line GL is formed to partition an annular opening on the surface (i.e. the upper surface) of the second electrostatic chuck 80. The gas line GL is configured to supply a heat transfer gas into a gap between the upper surface of the second electrostatic chuck 80 and the focus ring FR, and is connected to a heat transfer gas supply unit 90. The heat transfer gas supply unit 90 may supply a heat transfer gas, e.g., a He gas, into the gas line GL. Further, the gas line GL is connected to a depressurization pump 92.

The depressurization pump 92 and the gas line GL may serve to attract the focus ring FR to the second electrostatic chuck 80 under the atmospheric pressure and temporarily fix the focus ring FR to the second electrostatic chuck 80. To be more specific, the focus ring FR is mounted on the second electrostatic chuck 80 while a pressure within the space S is set to be the atmospheric pressure. Then, the focus ring FR is position-aligned with respect to the second electrostatic chuck 80 with a jig and mounted on the second electrostatic chuck 80. Then, the depressurization pump 92 is operated. Thus, a pressure difference between the gas line GL and the space S is made, so that the focus ring FR is attracted to the second electrostatic chuck 80. Then, the space S is depressurized, and the three AC voltages are respectively applied to the electrode 80a, the electrode 80b, and the electrode 80c. Thus, the temporarily fixed focus ring FR is electrostatically adsorbed on the second electrostatic chuck 80.

As such, in the plasma processing apparatus 10, the focus ring FR can be temporarily fixed under the atmospheric pressure without applying voltages to the electrode 80a, the electrode 80b, and the electrode 80c of the second electrostatic chuck 80. Thus, it is possible to avoid an electric shock and also possible to suppress dust in the atmosphere from being adsorbed on the second electrostatic chuck 80. Further, since the space S within the processing vessel 12 is depressurized while the focus ring FR is attracted to the second electrostatic chuck 80, it is possible to suppress a position of the focus ring FR from being deviated during the depressurization. Furthermore, since the position deviation of the focus ring FR is suppressed, it is possible to improve controllability of a temperature of the focus ring FR while the wafer W is processed. Moreover, since the focus ring FR can be electrostatically adsorbed on the second electrostatic chuck 80 while the focus ring FR is attracted to the second electrostatic chuck 80, it is possible to relieve an impact force to be applied to the focus ring FR when the second electrostatic chuck 80 is started to be electrostatically adsorbed.

Figure 4:
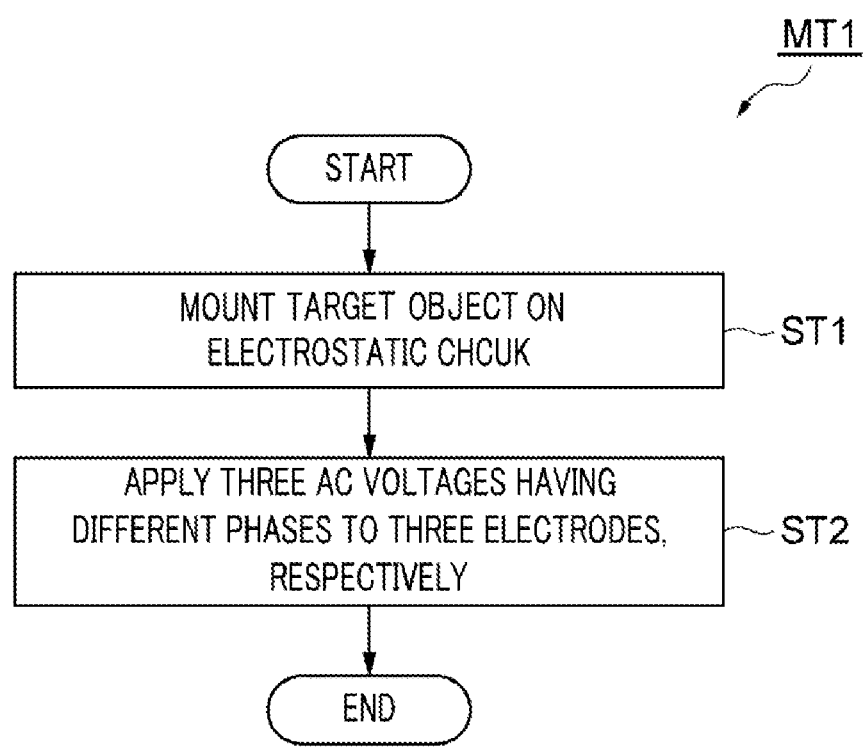
FIG. 4 is a flowchart showing a method of adsorbing a target object on a mounting table in accordance with the example embodiment.

Hereinafter, there will be explained a method of adsorbing a target object on a mounting table in accordance with the example embodiment. FIG. 4 is a flowchart showing a method of adsorbing the target object on the mounting table in accordance with the example embodiment. Hereinafter, there will be explained a method MT1 as shown in FIG. 4 in accordance with the example embodiment using the plasma processing apparatus 10 as the processing apparatus.

As depicted in FIG. 4, the method MT1 includes a process ST1 and a process ST2. In the process ST1 (Mount Target Object on Electrostatic Chuck), a target object is mounted on an electrostatic chuck of the mounting table 16. The target object may be, for example, a wafer W. In this example embodiment, the wafer W is mounted on the first electrostatic chuck 70. Further, if the wafer W is the target object, while a pressure within the space S in the processing vessel 12 is reduced to be lower than the atmospheric pressure, the wafer W is loaded into the processing vessel 12 and then mounted on the first electrostatic chuck 70.

Further, the target object may be, for example, a focus ring FR. In this example embodiment, the focus ring FR is mounted on the second electrostatic chuck 80. Further, if the focus ring FR is the target object, while a pressure within the space S in the processing vessel 12 is set to be the atmospheric pressure, the focus ring FR is loaded into the processing vessel 12 and then mounted on the second electrostatic chuck 80.

In the process ST2 (Apply Three AC Voltages Having Different Phases to Three Electrodes Respectively), three AC voltages having different phases are respectively applied to three electrodes of the electrostatic chuck. In the example where the wafer W is the target object, the three AC voltages having different phases are respectively applied to the electrode 70a, the electrode 70b, and the electrode 70c of the first electrostatic chuck 70. Thus, the wafer W is electrostatically adsorbed on the first electrostatic chuck 70.

Further, in the example where the focus ring FR is the target object, the three AC voltages having different phases are respectively applied to the electrode 80a, the electrode 80b, and the electrode 80c of the second electrostatic chuck 80. Thus, the focus ring FR is electrostatically adsorbed on the second electrostatic chuck 80.

Figure 5A:
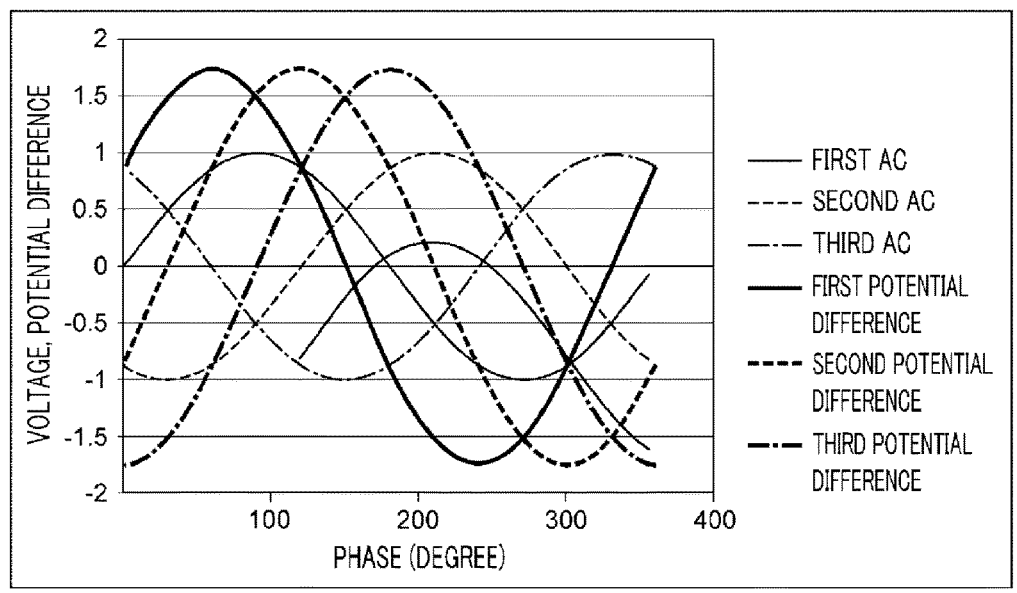
FIG. 5A is a graph showing waveforms of AC voltages respectively applied to three electrodes of the electrostatic chuck and potential differences between the electrodes of the electrostatic chuck.
Figure 5B:
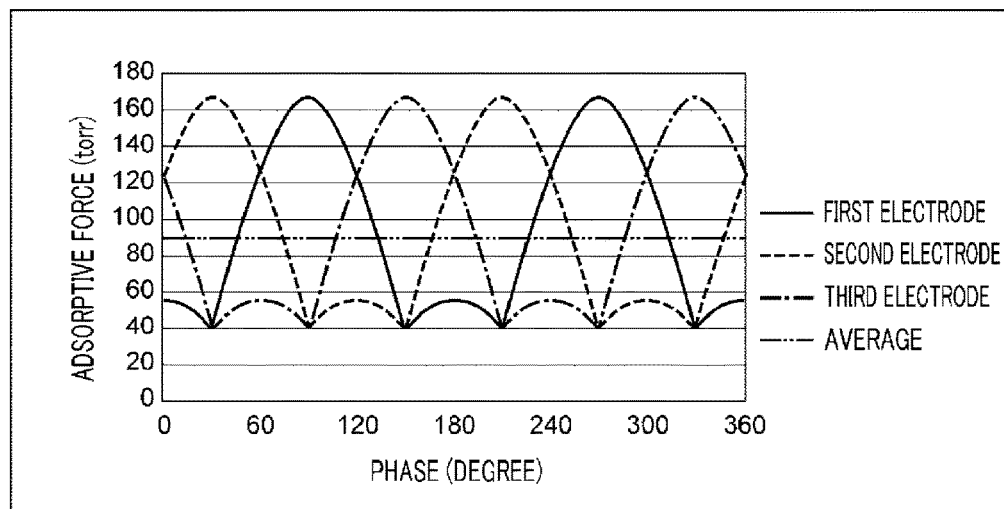
FIG. 5B is a graph showing a relationship between a phase and an adsorptive force of the electrostatic chuck right above each electrode.

Hereinafter, referring to FIG. 5A and FIG. 5B, a graph of FIG. 5A shows waveforms of the AC voltages respectively applied to three electrodes of the electrostatic chuck and potential differences among the electrodes of the electrostatic chuck, and a graph of FIG. 5B shows a relationship between the phase and the adsorptive force of the electrostatic chuck right above each electrode. In the graph of FIG. 5A, the waveform indicated by a legend "First AC" is a waveform of an AC voltage applied to the electrode 70a of the first electrostatic chuck 70 or the electrode 80a of the second electrostatic chuck 80; the waveform indicated by a legend "Second AC" is a waveform of an AC voltage applied to the electrode 70b of the first electrostatic chuck 70 or the electrode 80b of the second electrostatic chuck 80; and the waveform indicated by a legend "Third AC" is a waveform of an AC voltage applied to the electrode 70c of the first electrostatic chuck 70 or the electrode 80c of the second electrostatic chuck 80. Further, in the graph of FIG. 5A, the potential difference indicated by a legend "First Potential Difference" is a potential difference between the electrode 70*a* and the electrode 70*b* or a potential difference between the electrode 80*a* and the electrode 80*b*; the potential difference indicated by a legend "Second Potential Difference" is a potential difference between the electrode 70*a* and the electrode 70*c* or a potential difference between the electrode 80*a* and the electrode 80*c*; and the potential difference indicated by a legend "Third Potential Difference" is a potential difference between the electrode 70*b* and the electrode 70*c* or a potential difference between the electrode 80*b* and the electrode 80*c*. Furthermore, in the graph of FIG. 5B, the adsorptive force indicated by a legend "First Electrode" is an adsorptive force of the electrostatic chuck right above the electrode 70*a* or the electrode 80*a*; the adsorptive force indicated by a legend "Second Electrode" is an adsorptive force of the electrostatic chuck right above the electrode 70*b* or the electrode 80*b*; and the adsorptive force indicated by a legend "Third Electrode" is an adsorptive force of the electrostatic chuck right above the electrode 70*c* or the electrode 80*c*. Moreover, in the graph of FIG. 5B, the adsorptive force indicated by a legend "Average" is an average value of adsorptive forces over the entire region of the electrostatic chuck.

As shown in the graph of FIG. 5A, all of the three AC voltages respectively applied to the three electrodes of the electrostatic chuck during the process ST2 cannot have the same potential at the same time. Therefore, in the period during which the three AC voltages are respectively applied to the three electrodes of the electrostatic chuck, i.e. in the application period, the potential differences between any two of the three electrodes of the electrostatic chuck are made. Thus, the positively charged region and the negatively charged region are formed on the surface of the electrostatic chuck. Furthermore, the surface of the target object facing the electrostatic chuck is electrified with polarities opposite to those of the surface of the electrostatic chuck. As a result, during the application period, the potential difference between the surface of the electrostatic chuck and the processing target object is continuously made. Therefore, as shown in the graph of FIG. 5B, during the application period, a state where the adsorptive force is continuously generated is maintained. Further, the AC voltages, each having a positive voltage and a negative voltage alternately, are respectively applied to the three electrodes of the electrostatic chuck. Thus, it is possible to suppress an amount of electric charges on the surface of the electrostatic chuck. Therefore, it is possible to suppress the adsorptive force of the electrostatic chuck from being decreased and also possible to suppress the electric charges from remaining on the surface of the electrostatic chuck.

Figure 6:
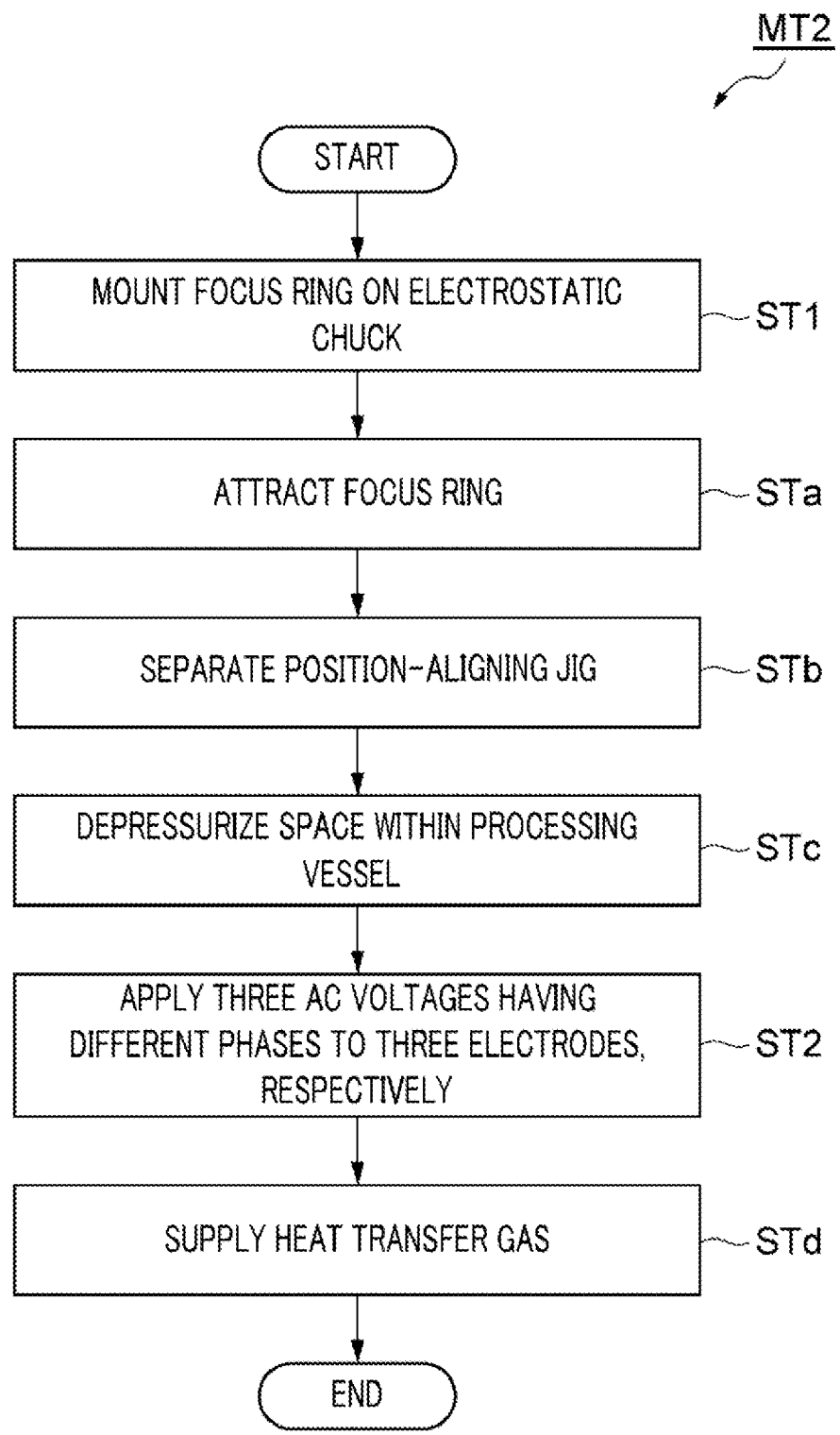
FIG. 6 is a flowchart showing a method of adsorbing a target object on a mounting table in accordance with another example embodiment.

Hereinafter, there will be explained a method of adsorbing a target object on a mounting table in accordance with another example embodiment. FIG. 6 is a flowchart showing the method of adsorbing the target object on the mounting table in accordance with the present example embodiment. Hereinafter, there will be explained a method MT2 as shown in FIG. 6 in accordance with the present example embodiment using the plasma processing apparatus 10 as the processing apparatus. In the method MT2 as shown in FIG. 6, the target object is the focus ring FR.

As shown in FIG. 6, the method MT2 includes a process STa, a process STb, and a process STc, which are performed between the process ST1 and the process ST2, and further includes a process STd, which is performed after the process ST2.

In the process ST1 (Mount Focus Ring on Electrostatic Chuck), a pressure of the space S within the processing vessel 12 is set to be the atmospheric pressure. Further, in the process ST1, the focus ring FR is loaded into the space S and position-aligned with the second electrostatic chuck 80 to be mounted on the second electrostatic chuck 80. In the process ST1, a jig may be used for position-aligning the focus ring FR.

In the following process STa (Attract Focus Ring), the depressurization pump 92 is operated to attract the focus ring FR to the second electrostatic chuck 80. Thus, the focus ring FR is temporarily fixed to the second electrostatic chuck 80.

In the process STb (Separate Positioning Jig), the jig is separated, and in the process STc (Depressurize Space within Processing Vessel), the gas exhaust device 50 is operated to depressurize the space S within the processing vessel 12. Even in the process STc, a state where the focus ring FR is attracted to the second electrostatic chuck 80 is maintained. In the following process ST2 (Apply Three AC Voltages Having Different Phases to Three Electrodes Respectively), three AC voltages having different phases are respectively applied to the electrode 80*a*, the electrode 80*b*, and the electrode 80*c* of the second electrostatic chuck 80. Thus, the focus ring FR is electrostatically adsorbed on the second electrostatic chuck 80. In the following process STd (Supply Heat Transfer Gas), the operation of the depressurization pump 92 is stopped, and a heat transfer gas is supplied into the gas line GL.

In the method MT2, during the processes under the atmospheric pressure, i.e. during the process ST1, the process STa, and the process STb, the focus ring FR can be temporarily fixed without applying the voltages to the electrodes of the second electrostatic chuck 80. Therefore, during the processes under the atmospheric pressure, it is possible to avoid an electric shock and also possible to suppress the dust in the atmosphere from being adsorbed on the second electrostatic chuck 80.

Further, during the depressurization of the process STc, a state where the focus ring FR is attracted to the second electrostatic chuck 80 is maintained. Thus, it is possible to suppress the position deviation of the focus ring FR caused by the air flow generated when the space S is depressurized. Further, in the method MT2, since the position deviation of the focus ring FR is suppressed, it is possible to improve controllability of a temperature of the focus ring FR while the wafer W is processed. Furthermore, in the method MT2, since the focus ring FR is electrostatically adsorbed on the second electrostatic chuck 80 while maintaining the state where the focus ring FR is attracted to the second electrostatic chuck 80, it is possible to relieve the impact force to be applied to the focus ring FR when the process ST2 is started.

Figure 7:
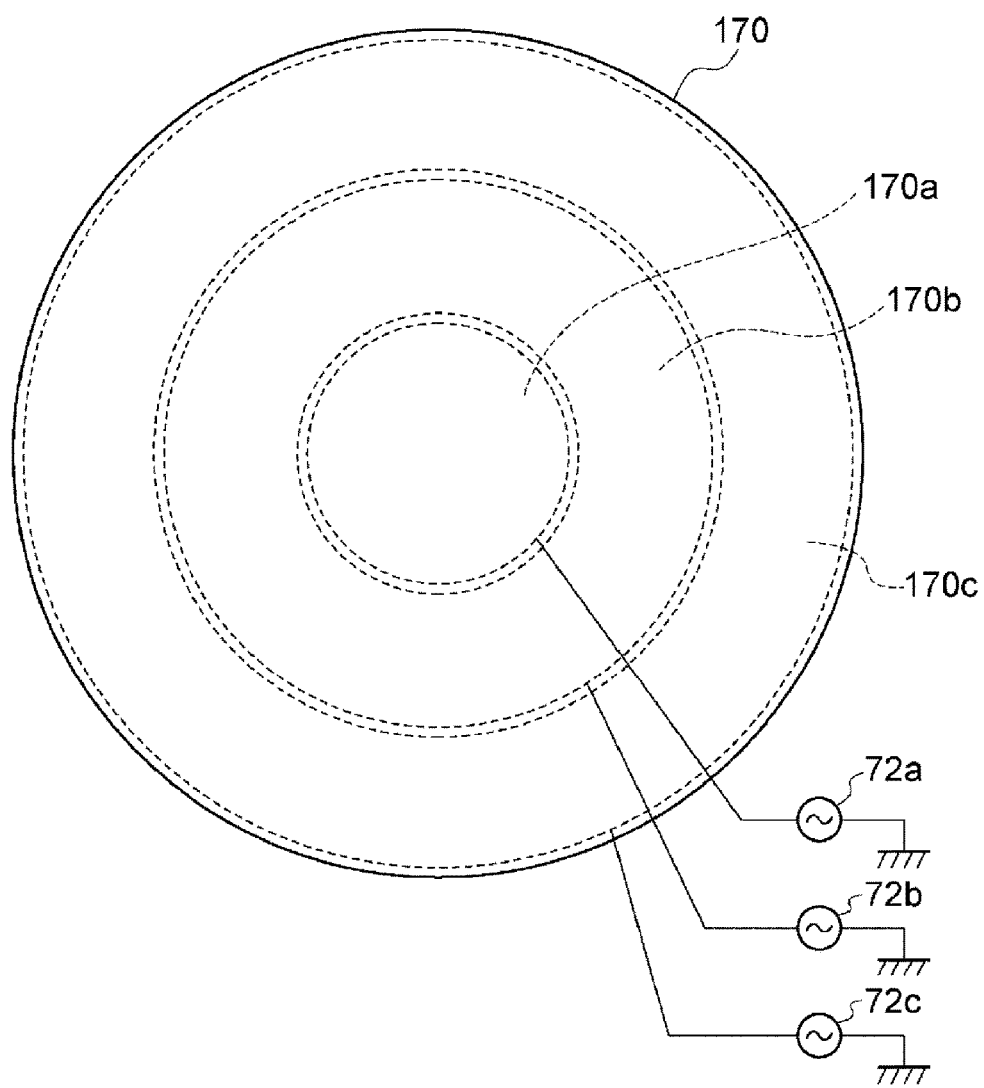
FIG. 7 is a plane view illustrating a first electrostatic chuck in accordance with another example embodiment.

Hereinafter, there will be explained a first electrostatic chuck in accordance with another example embodiment. FIG. 7 is a plane view illustrating a first electrostatic chuck in accordance with the present example embodiment. A first electrostatic chuck 170 depicted in FIG. 7 can be used in the plasma processing apparatus 10 instead of the first electrostatic chuck 70. The first electrostatic chuck 170 includes an electrode 170*a*, an electrode 170*b*, and an electrode 170*c*. The electrode 170*a*, the electrode 170*b*, and the electrode 170*c* are annularly extended with respect to the central axis line of the first electrostatic chuck 170. Further, the electrode 170*a*, the electrode 170*b*, and the electrode 170*c* are coaxially provided with respect to a central axis line of the first electrostatic chuck 170. To be specific, the electrode 170*b* is provided at an outside of the electrode 170*a*, and the electrode 170*c* is provided at an outside of the electrode 170*b*. The electrode 170*a*, the electrode 170*b*, and the electrode 170c are connected to a power supply 72a, a power supply 72b, and a power supply 72c, respectively. In the first electrostatic chuck 170, three AC voltages having different phases are respectively applied to the electrode 170a, the electrode 170b, and the electrode 170c. In the first electrostatic chuck 170, as compared with the above-described first electrostatic chuck 70, shapes and arrangement of three electrodes provided in the first electrostatic chuck can be optionally changed.

Figure 8:
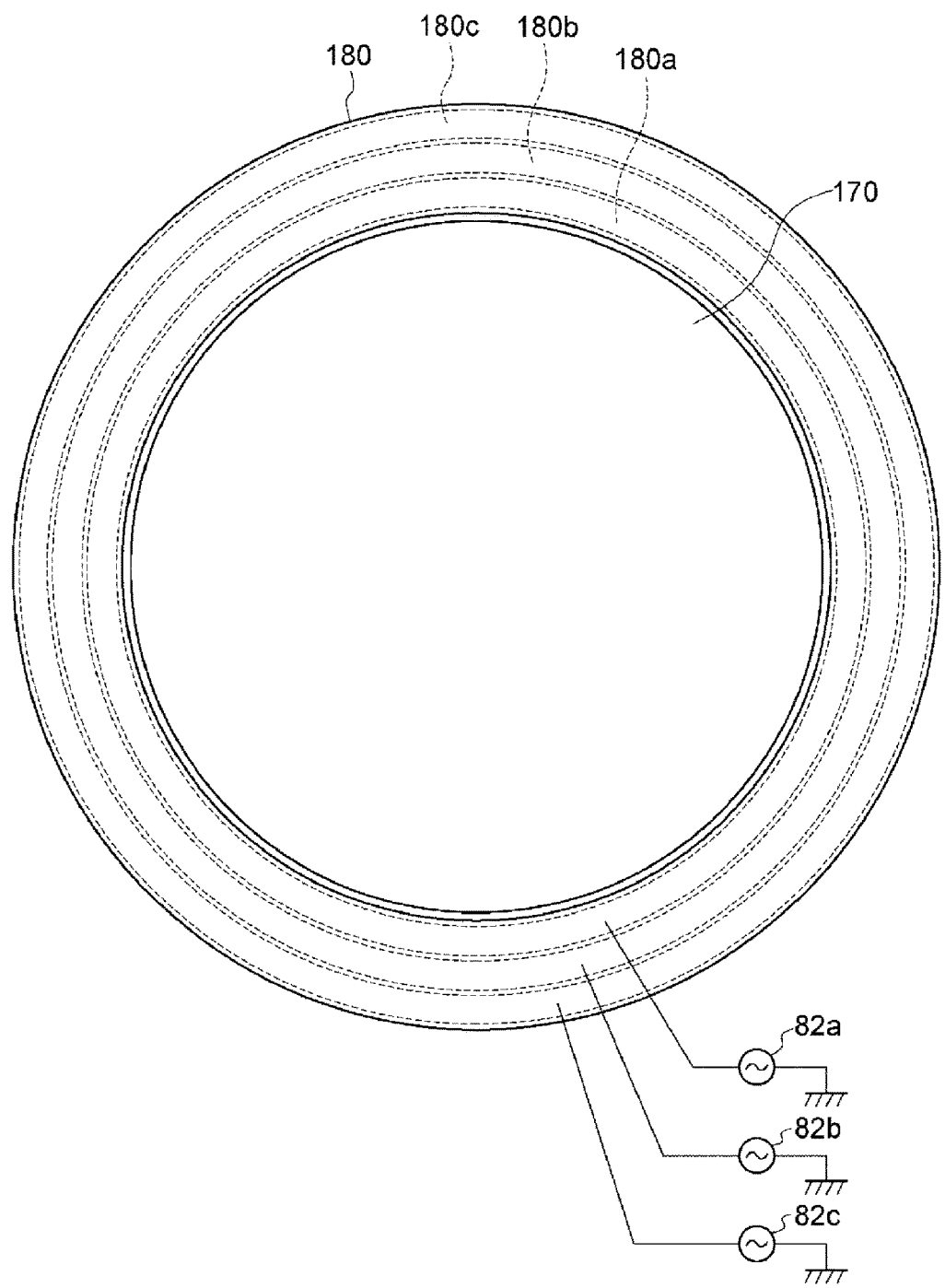
FIG. 8 is a plane view illustrating a second electrostatic chuck in accordance with another example embodiment.

Hereinafter, there will be explained a second electrostatic chuck in accordance with the present example embodiment. FIG. 8 is a plane view illustrating a second electrostatic chuck in accordance with the present example embodiment. A second electrostatic chuck 180 depicted in FIG. 8 can be used in the plasma processing apparatus 10 instead of the second electrostatic chuck 80. The second electrostatic chuck 180 includes an electrode 180a, an electrode 180b, and an electrode 180c. The electrode 180a, the electrode 180b, and the electrode 180c are annularly extended with respect to a central axis line of the second electrostatic chuck 180. Further, the electrode 180a, the electrode 180b, and the electrode 180c are coaxially provided with respect to the central axis line of the second electrostatic chuck 180. To be specific, the electrode 180b is provided at an outside of the electrode 180a, and the electrode 180c is provided at an outside of the electrode 180b. The electrode 180a, the electrode 180b, and the electrode 180c are connected to a power supply 82a, a power supply 82b, and a power supply 82c, respectively. In the second electrostatic chuck 180, three AC voltages having different phases are respectively applied to the electrode 180a, the electrode 180b, and the electrode 180c. In the second electrostatic chuck 180, as compared with the above-described second electrostatic chuck 80, shapes and arrangement of three electrodes provided in the second electrostatic chuck can be optionally changed.

Various example embodiments have been explained above, but various modified examples can be constructed without limitation to the above-described example embodiments. By way of example, the plasma processing apparatus 10 in the above-described example embodiments includes the first electrostatic chuck and the second electrostatic chuck. However, a plasma processing apparatus in other example embodiments may include only one of the first electrostatic chuck and the second electrostatic chuck. Further, the plasma processing apparatus 10 is configured to apply two high frequency powers to the lower electrode. However, the high frequency bias power may be applied to the lower electrode and the high frequency power for plasma generation may be applied to the upper electrode. Further, the plasma processing apparatus 10 includes the capacitively coupled plasma source. However, a plasma source for a plasma processing apparatus is not limited thereto. By way of example, a plasma processing apparatus may include an inductively coupled plasma source or a plasma source that generates a surface wave such as a microwave.

Although the processing apparatus of the above-described example embodiments is the plasma processing apparatus, the processing apparatus may employ any processing apparatus as long as it can process a target object under a depressurized environment.

Further, in the above-described example embodiments, three electrodes of the electrostatic chuck are connected to three power supplies, respectively. However, the three AC voltages may be based on an AC voltage generated from a single power supply.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A plasma processing apparatus for processing a processing target object within a depressurized space, the plasma processing apparatus comprising:
    a processing vessel that partitions a depressurizable space;
    a mounting table, provided within the processing vessel, having an electrostatic chuck which is for a focus ring and has three electrodes and including a gas line through which a heat transfer gas is supplied into a gap between the electrostatic chuck and the focus ring;
    a power supply configured to apply three AC voltages having different phases to the three electrodes, respectively, to adsorb a target object on the electrostatic chuck; and
    a depressurization pump connected to the gas line; and
    a control unit configured to control the processing vessel, the depressurization pump and the power supply,
    wherein the control unit is further configured to:
    control the depressurization pump such that the focus ring is attracted to the electrostatic chuck after the target object is mounted on the electrostatic chuck,
    control the processing vessel such that the depressurizable space is depressurized after the focus ring is attracted to the electrostatic chuck, and
    control the power supply such that the three AC voltages having different phases are applied to the three electrodes of the electrostatic chuck, respectively after the depressurizable space is depressurized.

2. The plasma processing apparatus of claim 1, wherein the mounting table further has another electrostatic chuck for a wafer.

* * * * *